United States Patent [19]
Nolan

[11] Patent Number: 4,872,127
[45] Date of Patent: Oct. 3, 1989

[54] RIPPLE REJECTION FILTER

[75] Inventor: Dennis C. Nolan, West Allis, Wis.

[73] Assignee: MagneTek, Inc., Los Angeles, Calif.

[21] Appl. No.: 142,688

[22] Filed: Jan. 7, 1988

[51] Int. Cl.$^4$ .............................................. G06J 1/00
[52] U.S. Cl. ..................................... 364/602; 363/45; 364/724.08
[58] Field of Search ............... 364/602, 600, 724, 604, 364/825, 724.01, 724.08; 323/211; 363/45–48; 333/166–168, 173, 175, 176; 328/167; 307/520, 521, 543, 556, 490, 498

[56] References Cited

U.S. PATENT DOCUMENTS

| | | | |
|---|---|---|---|
| 3,894,219 | 7/1975 | Weigel | 364/602 |
| 3,980,872 | 9/1976 | Fettweis, et al. | 328/167 |
| 4,017,812 | 4/1977 | Bonnefoy-Claudet | 333/165 |
| 4,096,576 | 6/1978 | Takashi et al. | 364/602 |
| 4,197,515 | 4/1980 | Hornfeldt et al. | 333/165 |
| 4,319,207 | 3/1982 | Gignoux | 333/173 |
| 4,333,064 | 6/1982 | Kato et al. | 333/173 |
| 4,358,818 | 11/1982 | Rosa | 363/46 |
| 4,459,548 | 7/1984 | Lentz et al. | 363/46 X |

OTHER PUBLICATIONS

Intel Application Note AP-248, Using the 8096, Intel Corporation, 1985.
Descrete-Data Control Systems by B. C. Kuo, Prentice Hall, Inc., Anglewood Cliffs, New Jersey, 1970.
SCR Manual 5th Edition, D. R. Grafham and J. C. Hey, Editors, General Electric Company, Syracuse, New York, 1972.

Primary Examiner—Joseph Ruggiero
Attorney, Agent, or Firm—Faegre & Benson

[57] ABSTRACT

A ripple rejection filter for removing the fundamental frequency of load voltage from control signals in closed-loop phase controlled systems operating from an AC power source. A low-pass filter is connected in parallel with a firing point synchronized sample and hold and high-pass filter series combination. The output of the low-pass and high-pass filters are combined to produce a resulting signal representative of an input signal but with ripple rejected.

39 Claims, 5 Drawing Sheets

RIPPLE REJECTION FILTER

BACKGROUND OF THE INVENTION

In the past, many efforts have been expended to eliminate ripple (the fundamental frequency of load voltage) from control signals in closed-loop feedback control systems operating from an AC power source, since it is common that such ripple is (or could be) within the operating bandwidth of the control system and hence would interfere with performance.

One approach has been to limit operating bandwidth in order to avoid having such control systems respond to the ripple frequency. Another approach has been to use relatively complex (and hence costly) filters to eliminate such ripple.

However, certain errors will be present when various known ripple elimination techniques are used. For example, using a simple analog low-pass filter to eliminate ripple provides good steady state accuracy, but poor transient fidelity, and, when used on a feedback signal in a closed-loop control system, will tend to cause system instability.

Another technique which has been investigated is to perform synchronous sampling of a signal in a system having a fixed frequency or periodic ripple characteristic. This technique will reduce ripple, but is generally much less accurate than the simple first order low pass analog filter in steady state performance. For example, and by way of illustration, within a range where the signal is continuous, 10% accuracy can be achieved. Outside this range, however, where the signal is discontinuous, as is often the case, steady state error can approach 100% of the reading. Such errors are intolerable when the signal of interest is the prime variable to be controlled, as for example armature current in a motor operated from an AC power supply. In such a system, rapid transient response and accurate, tightly controlled steady state performance are often required.

In the digital domain, one technique which has been used to reject ripple is to sample a signal to be filtered at a rate typically ten or more times faster than the highest frequency component of interest in the signal, to avoid "aliasing" and distorting the signal. Unfortunately, this technique has been found to make prodigal use of digital systems' resources, tying-up hardware or operating overhead in signal capture and processing.

The present invention overcomes the shortcomings of the various approaches of the prior art by utilizing a combined analog and digital technique to provide rapid and high fidelity transient response and accurate steady state performance with a great reduction in digital system overhead in comparison to conventional 10x sampling techniques.

DETAILED DESCRIPTION

The present invention is particularly useful in phase-controlled systems operating from alternating current power supplies, where the ripple frequency is dependent upon both the supply frequency and the nature of the phase angle control circuit. For example, with a single-phase half-wave circuit the ripple frequency is the same as the supply frequency; while for a three-phase full-wave circuit the ripple frequency is 6 times the supply frequency. If the supply frequency is 60 Hertz, the ripple frequency is 360 Hertz for such three-phase full-wave phase control circuit.

Figure 1:
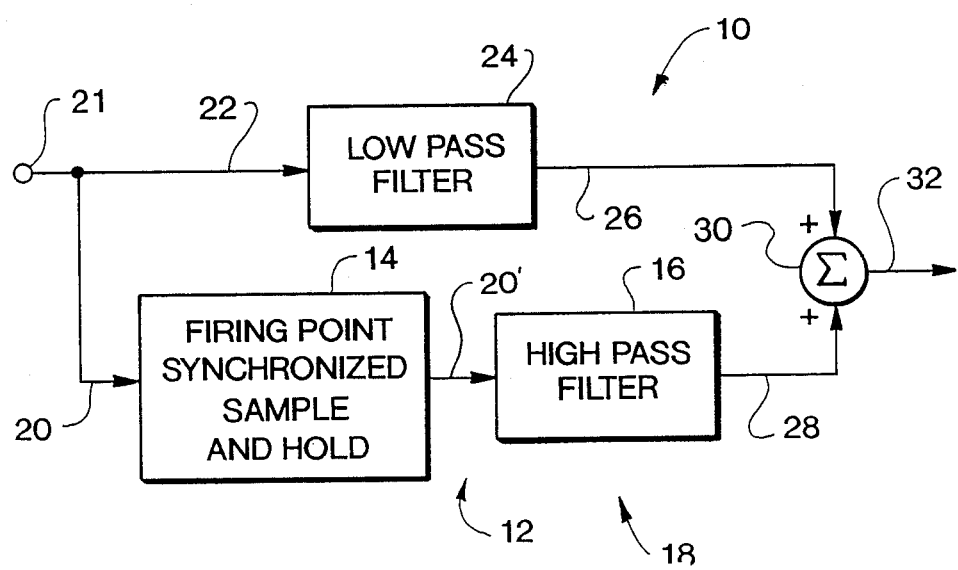
FIG. 1 shows a block diagram of the present invention.

Referring now to FIG. 1, a block diagram of the ripple rejection filter 10 of the present invention includes a series connection 12 of a firing point synchronized sample and hold element 14 and a high pass filter 16, which may take the form of a digital filter 18. Digital filter 18 has an input 20' which indicates a digitized form of an input 20 which is received from input port 21. Input port 21 is also connected to line 22 of a low pass filter 24. Low pass filter 24 has an output 26 and digital filter 18 has an output 28, each of which are combined at a summing junction 30 to produce an output 32 of the ripple rejection filter 10. In the practice of this invention, filters 16 and 24 desirably have the same characteristic time constant. Outputs 26 and 28 are desirably in compatible format, which may be analog, digital or a hybrid of the two.

Figure 2:
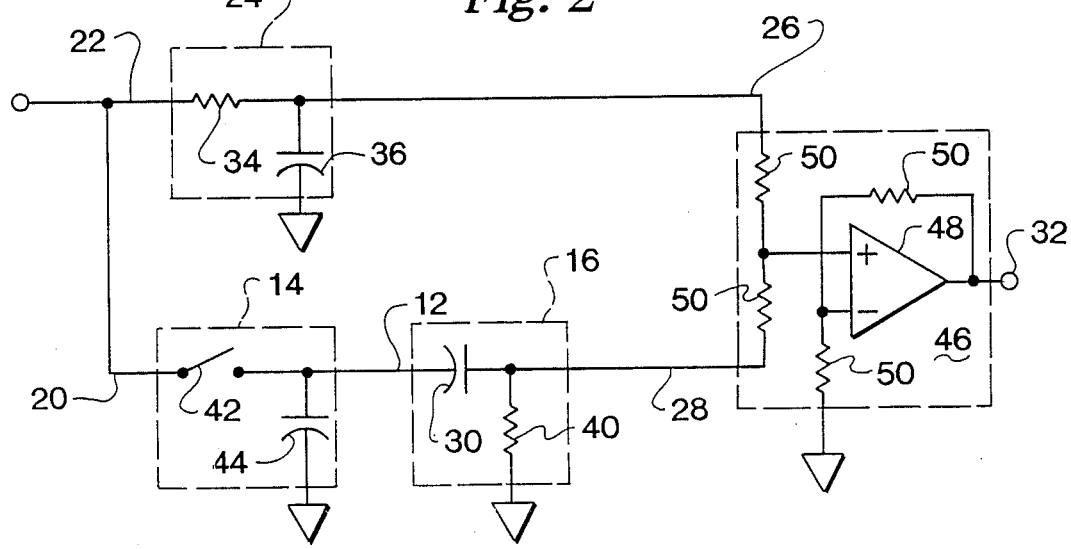
FIG. 2 shows a detailed schematic of one embodiment of the present invention.

Referring now to FIG. 2, a more detailed view of one embodiment of FIG. 1 includes low pass filter 24 which may take the form of a first order RC filter having a series resistance 34 and a shunt capacitance 36. In this embodiment, filter 24 has a low-pass characteristic and time constant equal to its RC product. High pass filter 16 may take the form of a first order RC filter having a series capacitance 30 and a shunt resistance 40. In this embodiment, filter 16 has a high pass characteristic and time constant equal to its RC product.

In FIG. 2, the firing point synchronized sample and hold circuit 14 is shown in greatly simplified form as a series switch 42 and shunt capacitance 44; circuit 14 is also known as a Sampler and Zero-Order Hold. It is to be understood, however, that while switch 42 would be operated in a regular periodic manner for a traditional sampler, the operation of switch 52 in the practice of this invention is significantly different in that here switch 42 is synchronized to the firing point in each phase of the associated phase-angle firing control. As a result, switch 42 will operate in a regular periodic manner at the ripple frequency in steady state operation, but will exhibit aperiodic performance during transient (phase-angle changing) operation.

The summing junction or combining means 30 shown in block diagram form in FIG. 1 may take the form of an operational amplifier circuit 46 as shown in FIG. 2. Circuit 46 combines the signals on lines 26 and 28 such that the resulting signal on line 32 corresponds to the signal at input port 21 but with the ripple removed or substantially attenuated. Circuit 46 preferably includes an integrated circuit type operational amplifier 48 connected for unity-gain, non-inverting operation, as is indicated by the four resistors 50 each having the same resistance. It is to be understood that circuit 46 may have other or different components (to give it additional characteristics, for example to provide bias or compensation or noise filtering for amplifier 48) and still be within the scope of this invention.

Figure 3:
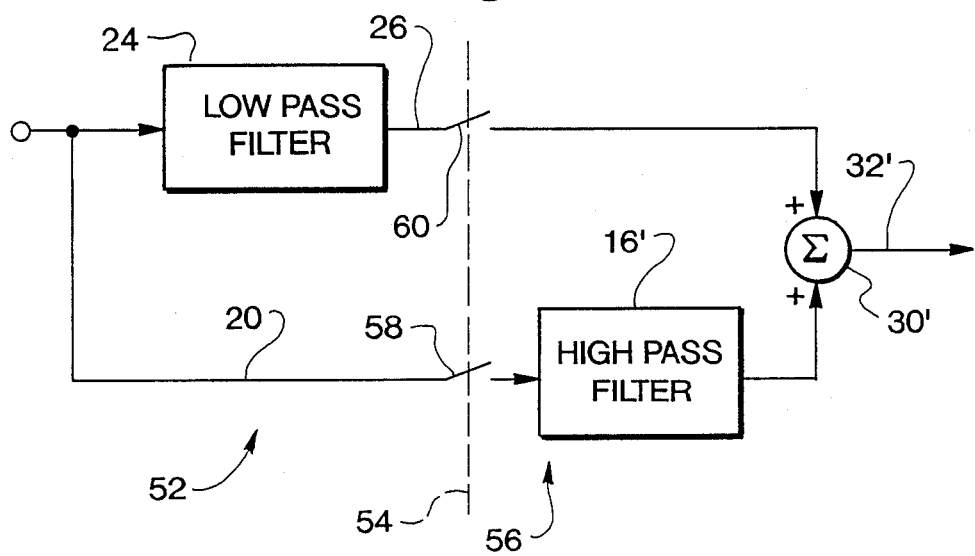
FIG. 3 shows an alternative block diagram of the present invention.

Referring now to FIG. 3, a block diagram for an alternative embodiment of hybrid filter 10 may have an analog section 52 (as shown to the left of a dashed line 54) and a digital section 56 (as shown to the right of line 54). Digital section 56 may further be embodied in general purpose digital hardware (such as a Model 8096 and 8097 microcontroller, available from Intel Corp., 3065 Bowers Avenue, Santa Clara, CA 95051). In the embodiment of FIG. 3, switch 58 is a simplified representation of a firing point synchronized sample and hold (corresponding to sample and hold circuit 14) and switch 60 represents means to convert the output 26 of filter 24 to a digital format compatible with digital section 56. Switch 60 may be a Sampler and Zero-Order Hold such as circuit 14, or an Analog to Digital Converter (or ADC) with a sampler preferably operated synchronously with sampler 58.

Alternatively, the sampler or digitizer of switch 60 may be operated asynchronously with sampler 58, provided that any error introduced by a difference in phase or frequency (or both) between samplers 58 and 60 is acceptable in the overall system in which the ripple rejection filter of this invention is operating. Digital section 56 may operate in serial or parallel bit format, as desired; for example, filter 16' may be a software filter operating on successive 16 bit words representing successive values of the signal on input line 20. In the embodiment of FIG. 3, output 32' is preferably in digital format, and may, for example, be in 16 bit parallel format suitable for further digital processing. In this embodiment, summing junction 30' may be a digital accumulator or Arithmetic Logic Unit (or ALU) consistent with digital filter 16' and the remainder of digital section 56.

Figure 4:
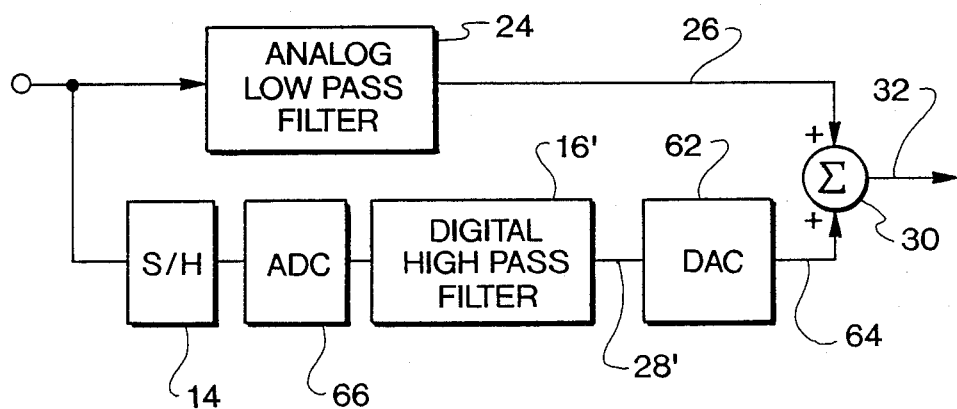
FIG. 4 shows a further alternative block diagram of the present invention.

A further alternative, shown in FIG. 4, may be to have a Digital to Analog Converter (or DAC) 62 convert the digital output 28' of filter 16' to analog format prior to combining outputs 26 and 64 in analog format at summing junction 30. This approach may be found useful where it is desired to have a direct analog output signal 32 in a hybrid system.

Figure 5:
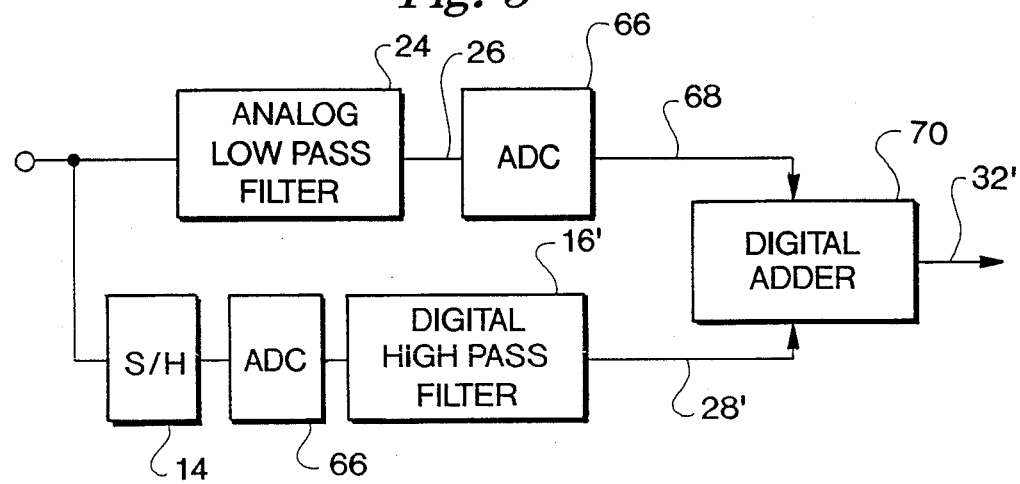
FIG. 5 shows a still further alternative block diagram of the present invention.

A still further alternative embodiment, shown in FIG. 5, may be found useful when dedicated (as opposed to general purpose, or programmable) digital logic is utilized for the control system in which filter 10 is to be used. In this embodiment, an ADC 66 converts output 26 to a digital format output 68 compatible with digital output 28'. A dedicated digital adder (such as a Model 74LS283 four bit adder with carry, available from Motorola, Inc., Phoenix, Arizona) 70 may be utilized to combine outputs 68 and 28' to provide a digital format output signal 32' compatible with downstream circuitry. It is to be understood that DAC 62 and ADC 66 may have either serial or parallel digital format, consistent with other digital circuitry in the system.

Figure 6:
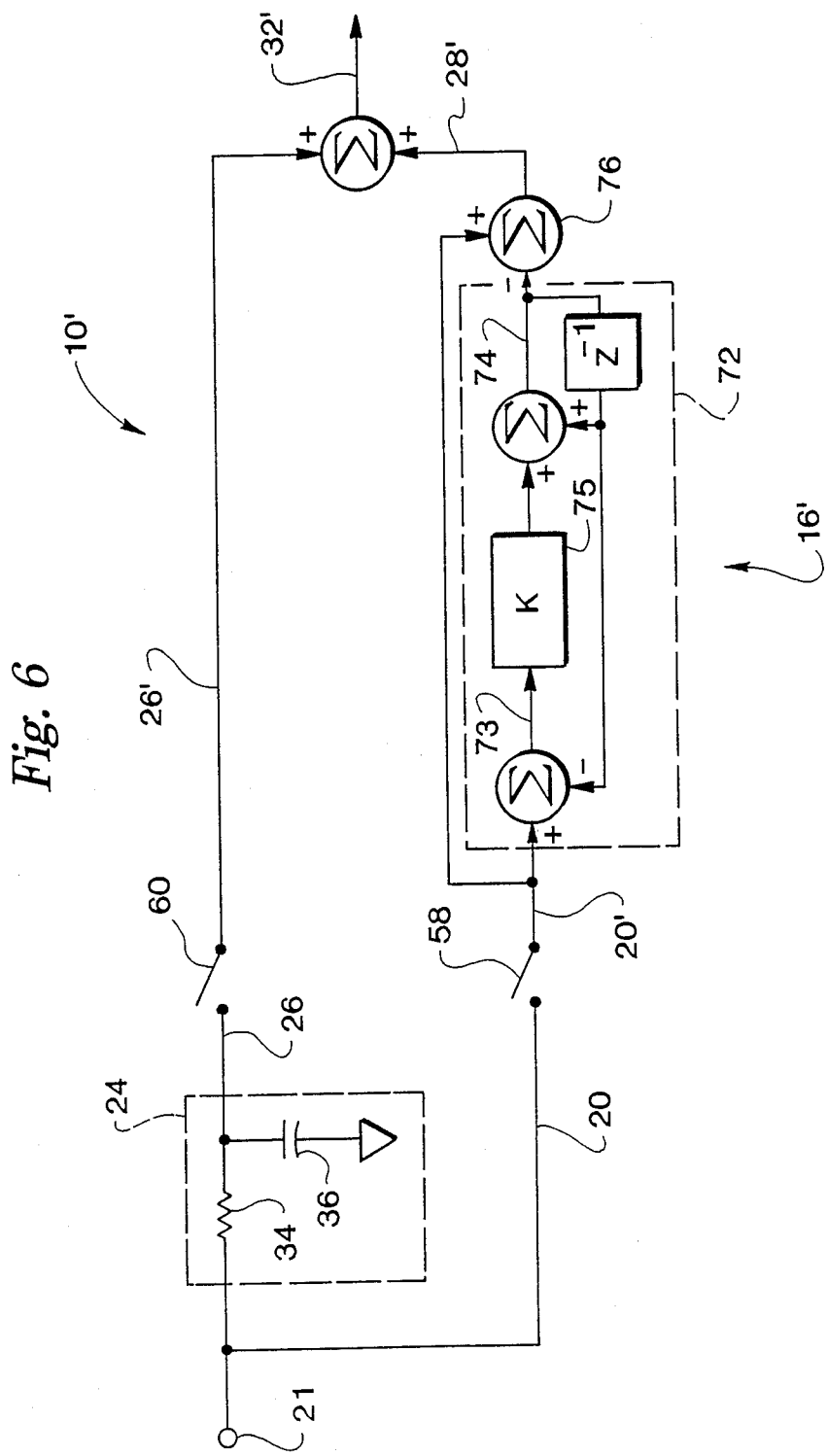
FIG. 6 shows a more detailed combined schematic and block diagram of the embodiment of FIG. 3.

Referring now to FIG. 6, a more detailed view of the block diagram of Dig. 3 may be seen. It is to be understood that FIG. 6, which is a combined schematic and block diagram, is intended to aid in the understanding of more details of this invention as are described hereinafter. In this embodiment, low pass filter 24 is connected to input port 21 and is made up of series resistance 34 and shunt capacitance 36, followed by a digitizer shown in simplified form by switch 60. Switch 58 represents a firing point synchronized digitizer connected to input port 21 by line 20. The digitizers of switches 58 and 60 may be implemented by the A to D converter in an 8097 microcontroller, with each utilizing one of the eight analog input channels addressable through the A/D COMMAND REGISTER. In this embodiment, the next sample time is scheduled in the Content Addressable Memory (CAM) file of the microcontroller. It has been found preferable to synchronize the next sample time by scheduling it 10 electrical degrees after the next scheduled phase firing point for the bridge or power section of the system.

Digital filter 16' (shown in a Z-transform representation) includes a feed-forward digital low pass filter 72 connected in parallel with the firing point synchronized sampled signal to be filtered on line 20'. The output 74 of filter 72 is subtracted from the signal on line 20' by a digital summing junction 76 resulting in digital high pass filter 16'.

In the Z-transform representation of low pass filter 72, the equivalent time constant $\tau$ is given by equation (1):

$$\tau = \frac{-T}{\ln(1 - K)} \quad (1)$$

where T is the sampling period and K is the gain of block 75.

For operation with a 60 Hz line or supply frequency where the ripple frequency is 360 Hz, as for example with a three-phase full-wave phase control system, the sampling period $T = 1/360$ and K is preferably 1/16 or 0.0625 giving an effective time constant of 43.04 milliseconds for filter 72 (and hence also for filter 16').

For operation with a 50 Hz power supply having a ripple frequency 6 times the power supply frequency, $T = 1/300$ and $K = 1/13.419$ (approximately).

In this embodiment, the digital filter 16' is in the form of instructions, or software, executing the Z-transform of filter 72 to provide output 28', and digital summing junction 30' is an arithmetic register of the microcomputer executing the Z-transform instructions.

The following code is a preferred software implementation of digital filter 16' in 8097 assembly language. On entry, it is assumed that the two 16 bit scratchpad registers (WORD0 and WORD1) contain the twos complement digital format representation of the signals on lines 20' and 26' respectively.

Other variables used in the code are defined as follows:

LONG0 is a 32 bit long scratchpad register.

CUR_FLTR_OUT is a 16 bit memory location which holds the integer part of the signal on line 74.

CUR_FLTR_OUT_FRAC is a 16 bit memory location which holds the fractional part of the signal on line 74.

NOTE: CUR_FLTR_OUT and CUR_FLTR_OUT_FRAC are taken together as a 32 bit fixed point binary number, with the BINARY point assumed between the two 16 bit words. The actual value of the variable may be represented as:

$$\text{CUR\_FLTR\_OUT} + \frac{\text{CUR\_FLTR\_OUT\_FRAC}}{65,536}$$

CURRENT_FEEDBACK is a 16 bit memory location which holds signal on line 32′.

The assembly language code (with comments) for the digital portion 56 of ripple rejection filter 10′ is as follows:

| | |
|---|---|
| LD LONG0+2,WORD0 | ;LOAD LONG0 WITH SIGNAL 20′ AND EXTEND TO |
| CLR LONG0 | ;32 BIT FORMAT (FRACTIONAL = 0) |
| SUB LONG0,CUR_FLTR_OUT_FRAC | ;SUB LAST LOW PASS OUTPUT TO CALCULATE |
| SUBC LONG0+2,CUR_FLTR_OUT | ;SIGNAL 73 AND HOLD IN LONG0 |
| SHRAL LONG0,#4 | ;DIVIDE SIGNED RESULT BY 16 |
| ADD LONG0,CUR_FLTR_OUT_FRAC | ;ADD LAST LOW PASS OUTPUT TO CALCULATE |
| ADDC LONG0+2,CUR_FLTR_OUT | ;SIGNAL 74 AND HOLD IN LONG0 |
| ST LONG0,CUR_FLTR_OUT_FRAC | ;SAVE SIGNAL 74 |
| ST LONG0+2,CUR_FLTR_OUT | ;IN MEMORY |
| NEG LONG0+2 | ;CALCULATE SIGNAL 28′ IN 16 BIT (INTEGER) |
| ADD LONG0+2,WORD0 | ;FORMAT AND HOLD IN LONG0+2 |
| ADD LONG0+2,WORD1 | ;CALCULATE SIGNAL 32′ |
| ST LONG0+2,CURRENT_FEEDBACK | ;STORE FINAL RESULT TO MEMORY |

Further information on 8097 instructions may be found in application note AP-248, using the 8096, by Ira Horden, published by Intel Corp., expressly incorporated by reference herein.

It has been found preferable to use a 432K ohm resistor for series resistance 34 and a 0.1 uf capacitor for shunt capacitance 36 in combination with this digital filter software implementation. Although this combination of resistance and capacitance gives a theoretical time constant of 43.2 msec for filter 24, and would require $K=1/16.05735799$ (for 60 Hz, 6x ripple frequency operation) it has been found satisfactory to use $K=1/16$ as an approximation to equalizing the characteristic time constants of filters 24 and 26′. Using $K=1/16$ greatly simplifies the binary arithmetic in software implementations.

In brief, the operation of this embodiment of a method of filtering a signal in a system having firing point for phase-control of power from an alternating current source includes the following steps:

1. Passing the signal to be filtered through an analog low pass filter 24 having a relatively long time constant to provide an analog filtered signal at line 26;

2. Simultaneously passing the signal to be filtered (on line 20) through a sampling switch 58 synchronized (as at 96) to the phase-control firing point 95 to provide a sampled signal at line 20′;

3. Passing the sampled signal on line 20 through a digital high pass filter 16′ having an effective time constant equal to the time constant of the analog low pass filter 24 to provide a digital filtered signal at line 28′; and 4. Adding the analog filtered signal on line 26 and the digital filtered signal on line 28 together in summing junction 30′ to provide an output signal on line 32′ representative of the signal to be filtered on line 20 but with the ripple attributable to the alternating current source substantially attenuated.

Figure 7:
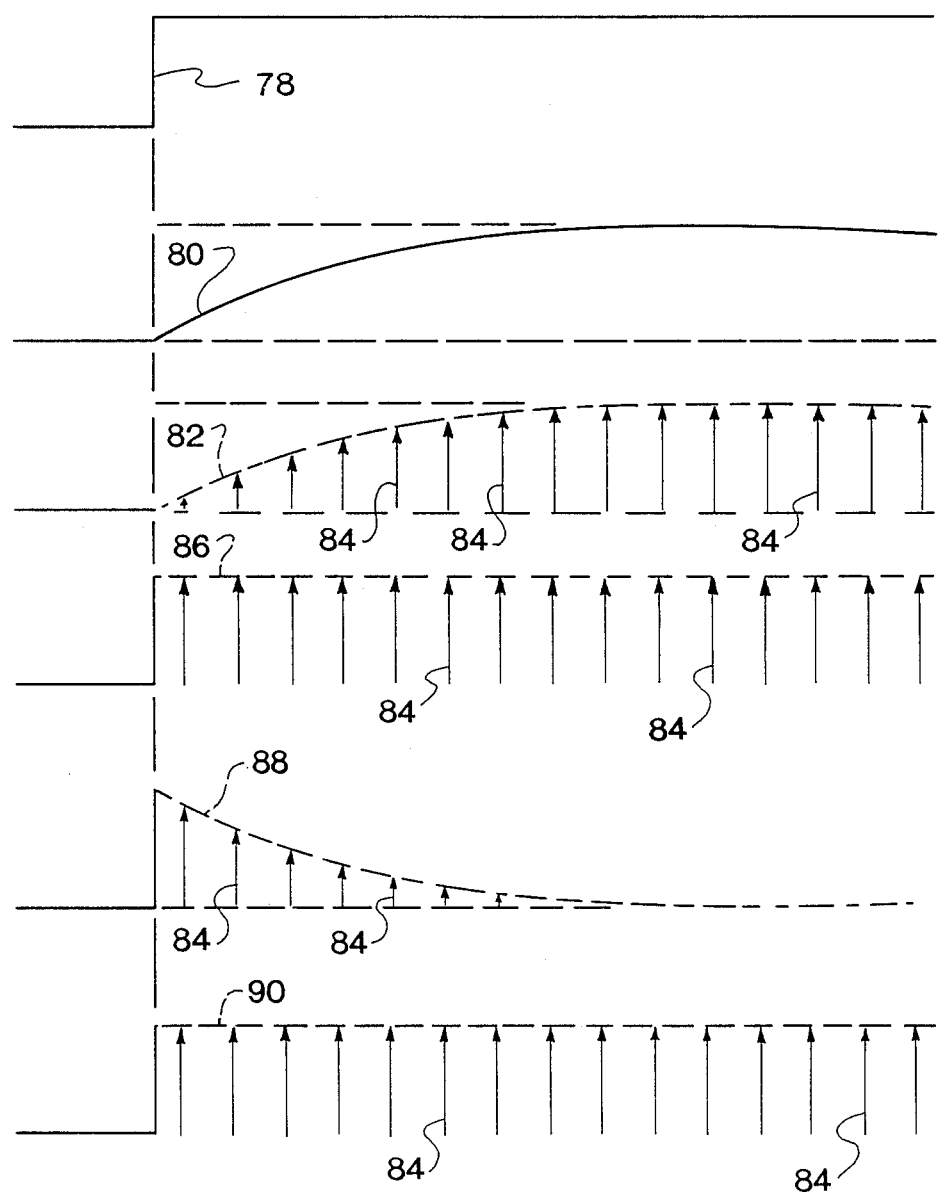
FIG. 7 shows simplified step response characteristics corresponding to the present invention.

Referring now to FIG. 7, a step function input and simplified response characteristics of the present invention may be seen. In response to a step function input signal 78 applied to inputs 20 and 22, an exponential signal response 80 occurs at output 26 with a first order type filter 24. A substantially identical result 82 would appear on output line 74 (at sampled data points 84) in response to a sampled step function signal 86 appearing at the input 20′ of the digital low-pass filter 72. Subtracting output 74 from the sampled step function on line 20′ (of FIG. 6) results in a high-pass exponential characteristic 88 appearing on line 28′. Adding the signals on lines 26′ and 28′ results in a reconstruction 90 of the original input waveform 78 at the sampled data points 84, but with the ripple or frequency components at the sampling frequency and integer multiples thereof substantially attenuated or rejected.

It is to be understood that in a software implementation of this invention there may not be any physically identifiable signal paths corresponding to line 26′, 28′, 73 and 74. Similarly signals 82–90 may not be physically identifiable in the form shown in FIG. 7 since in a digital filter software embodiment the information corresponding to "signals" 82–90 on "lines" 26′, 28′, 73, 74 et cetera may exist only in a digital form such as a succession of multi-bit binary numbers or signals processed within a microcontroller or microprocessor-based system.

It is to be further understood that, although the sampled data points 84 are shown equidistantly spaced in FIG. 7, the actual point to point spaced will vary for a firing point synchronized sampler operating in transient conditions. This is because the firing point in AC phase control circuits may be adjusted within the allowable trigger angle range to provide for adjustable output from such circuits. For example, in a single-phase half-wave circuit the allowable trigger angle range is 180° (from full off to full on) while for a three-phase fullwave circuit with six controllable elements (such as is shown in FIG. 9) the firing point may be adjusted only over a 120° range.

Figure 8:
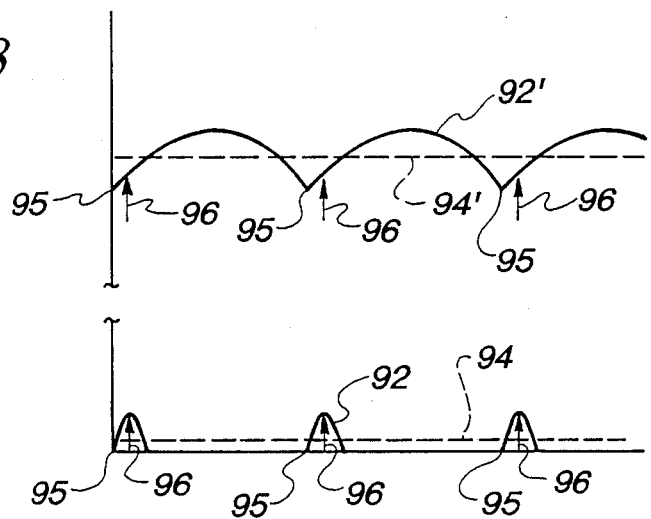
FIG. 8 shows waveforms illustrating the firing point synchronized sampling aspect of the present invention.

Referring now more particularly to FIG. 8, a control signal with substantial ripple may be seen. In this example, the signal 92 represents phase-controlled armature current in a DC motor control system powered from a three phase AC supply. In such a system, the current 92 may be discontinuous at low load levels, and continuous (as shown at 92′) at high load levels. The average value of discontinuous current 92 is indicated by line 94, while the average value of the continuous current 92′ is shown by line 94′. In such a system, it has been found preferable to synchronize sampling of armature current at 10° after the firing point 95 in each phase, as shown by arrows 96. In a three-phase system, there are 60 electrical degrees from one firing point to the next successive firing point. It is to be understood that actual waveforms may, in practice, be a combination of waveforms 78, 80 shown in FIG. 7 with the ripple component shown in FIG. 8 superimposed thereon. Ripple has been omitted from the waveforms of FIG. 7 to more clearly illustrate the transient performance of the embodiment of this invention shown in FIG. 6. It is further to be understood that although the sampling points 96 in FIG. 8 appear aligned between waveforms 92 and 92', in practice they ordinarily are not, since the firing point for waveform 92 is late in the allowable trigger angle range of the phase while the firing point for waveform 92' is early in the range.

Figure 9:
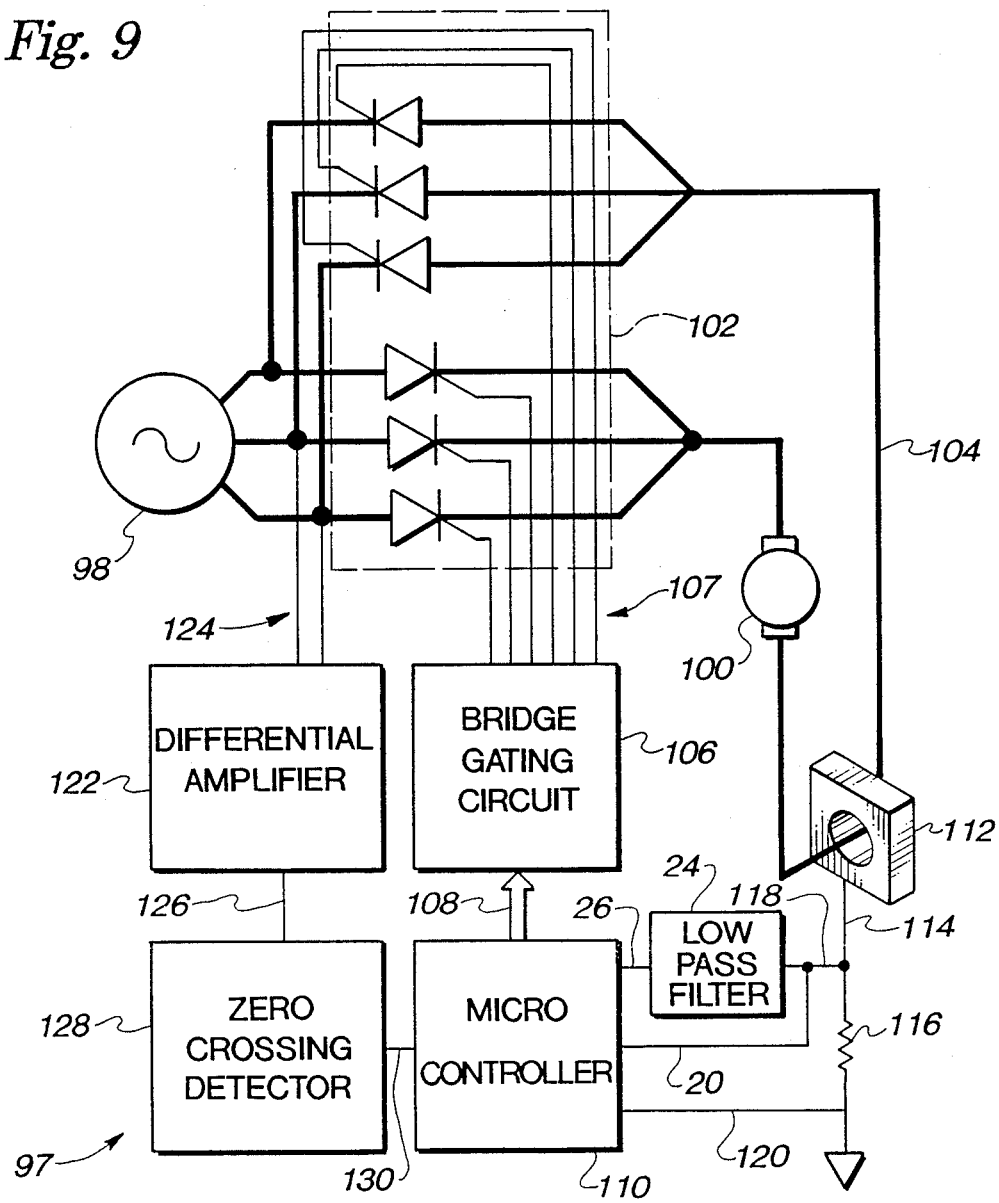
FIG. 9 shows a simplified schematic of a control system utilizing the present invention.

Referring now more particularly to FIG. 9, a simplified schematic of a phase control system 97 utilizing the present invention may be seen. A three-phase power supply 98 is connected to a DC motor armature 100 through a six SCR full wave rectifier bridge 102. Bridge 102 provides phase control of the current flowing in armature current path 104 through a conventional bridge gating circuit 106 having gate drive output lines 107. Gating circuit 106 is preferably driven through lines 108 by an 8096 or 8097 microcontroller or other microprocessor based system 110.

A current transducer 112, such as a model LA 50P manufactured by Liaisons Electroniques Mecaniques S. A. Geneve (LEM) 140, Chemin du Point-du Centenaire CH-1228 Plan-les-Ouates/Geneva, Switzerland provides a current signal on line 114 proportional to armature current in path 104. Resistor 116 preferably of 50 ohms converts the current signal output on line 114 to a voltage supplied to low pass filter 24 on line 118. The voltage across resistor 116 is also provided to microcontroller or computer 110 through line 20. Line 120 is circuit common.

A differential amplifier 122 receives signals on lines 124 from supply 98 and provides an output signal on line 126 to a zero crossing detector 128, which, in turn, provides a synchronizing signal on line 130 to microcontroller 110 to enable microcontroller 110 to synchronize the signals on lines 107 and 108 with the supply 98.

The invention is not to be taken as limited to all of the details thereof as modifications and variations thereof may be made without departing from the spirit or scope of the invention; for example, supply 98 may be a single phase supply; bridge 102 may be half-wave; the frequency of supply 98 may be 50 Hz, any or all of which are possible without departing from the scope of the invention.

What is claimed is:

1. A ripple rejection filter for filtering ripple from a signal in a phase-control system having an adjustable firing point, the filter comprising:
  (a) first filter means having an input for receiving a signal to be filtered and having an output for providing a filtered signal according to a low pass characteristic and a first filter means time constant;
  (b) firing point synchronized sampling means having an input connected to the signal to be filtered and having an output for providing a sampled signal sampled in synchronism with a firing point of a phase control system in which the ripple rejection filter is operating;
  (c) second filter means for receiving the sampled signal and for providing a filtered representation of the sampled signal according to a high pass characteristic with an effective time constant substantially equal to the first filter means time constant; and
  (d) combining means for combining the signals provided by the first and second filter means such that the resulting signal is representative of the signal to be filtered with the ripple substantially rejected.

2. The ripple rejection filter of claim 1 wherein the first and second filter means are each of the same order.

3. The ripple rejection filter of claim 2 wherein the first and second filter means are each of the first order.

4. The ripple rejection filter of claim 1 wherein the resulting signal is an analog signal.

5. The ripple rejection filter of claim 1 wherein the combining means comprises an analog summing junction.

6. The ripple rejection filter of claim 5 wherein the analog summing junction further comprises an analog amplifier.

7. The ripple rejection filter of claim 1 wherein the combining means further comprises a digital-to-analog converter.

8. The ripple rejection filter of claim 1 wherein the resulting signal is a digital signal.

9. The ripple rejection filter of claim 8 wherein the resulting signal is in a parallel-bit digital format.

10. The ripple rejection filter of claim 8 wherein the resulting signal is in serial-bit digital format.

11. The ripple rejection filter of claim 1 wherein the combining means comprises a digital adder.

12. The ripple rejection filter of claim 11 wherein the digital adder comprises an arithmetic register of a microcomputer.

13. The ripple rejection filter of claim 1 wherein the first filter means comprises an analog filter.

14. The ripple rejection filter of claim 1 wherein the second filter means comprises a digital filter.

15. The ripple rejection filter of claim 1 further comprising a further sampling means having an input connected to the output of the first filter means and having an output for providing a digital representation of the filter signal.

16. The ripple rejection filter of claim 15 further comprising means to operate the further sampling means at a fixed frequency.

17. The ripple rejection filter of claim 15 wherein the further sampling means is synchronized to the phase control firing point.

18. A method of filtering a signal in a system having a firing point for phase control of power from an alternating current source, the method comprising:
  (a) passing the signal to be filtered through an analog low pass filter having a long time constant to provide an analog filtered signal;
  (b) simultaneously passing the signal to be filtered through a sampling switch synchronized to the phase control firing point to provide a sampled signal;
  (c) passing the sampled signal through a digital high pass filter having an effective time constant equal to the time constant of the analog low pass filter to provide a digital filtered signal; and
  (d) adding the analog filtered signal and digital filtered signal together to provide an output signal representative of the signal to be filtered with ripple attributable to the alternating current source substantially attenuated.

19. The method of claim 18 wherein step (a) further comprises passing the signal to be filtered through a filter having a series resistance and a shunt capacitance.

20. The method of claim 18 wherein step (c) further comprises passing the sampled signal through a feed-forward digital low pass filter.

21. The method of claim 20 wherein step (c) further comprises subtracting the output of the feed-forward digital low pass filter form the sampled signal.

22. A combined analog and digital filter for filtering a predetermined ripple frequency from a signal, the filter comprising:
   (a) an analog filter having an input, an output and a low pass characteristic time constant;
   (b) a sampler synchronized in frequency to a predetermined ripple frequency and having an input connected in parallel with the analog filter input and having an output for providing a sampled signal;
   (c) a digital filter having an input connected in series with the sampler output, an output, and a high pass characteristic time constant equal to the low pass characteristic time constant of the analog filter;
   (c) means for combining the outputs of the analog and digital filters into a resulting output representative of an input signal but with the predetermined ripple frequency component substantially reduced.

23. The filter of claim 22 wherein the sampling input of the digital filter is variable in phase while remaining synchronized in frequency to the predetermined ripple frequency.

24. The combined analog and digital filter of claim 22 wherein each of the analog and digital filters are of the same order.

25. The combined analog and digital filter of claim 24 wherein each of the analog and digital filters are of first order.

26. The combined analog and digital filter of claim 22 wherein the digital filter operates in a parallel-bit format.

27. The combined analog and digital filter of claim 22 wherein the means for combining the outputs operates in a parallel-bit digital format.

28. The combined analog and digital filter of claim 22 wherein the analog filter comprises a series resistance followed by a shunt capacitance.

29. The combined analog and digital filter of claim 22 wherein the digital filter comprises a microcontroller containing instruction steps for operating as a digital high pass filter.

30. The combined analog and digital filter of claim 22 wherein the means for combining the outputs of the analog and digital filters further comprises a microcontroller.

31. The combined analog and digital filter of claim 30 wherein the microcontroller further comprises a plurality of instruction steps for combining the outputs of the analog and digital filters in a parallel-bit digital format.

32. The combined analog and digital filter of claim 22 wherein the digital filter comprises a microcomputer containing instruction steps for operating as a digital high pass filter.

33. The combined analog and digital of filter of claim 22 wherein the digital filter comprises a software filter.

34. The combined analog and digital filter of claim 22 wherein the digital filter and means for combining the outputs of the analog and digital filters comprise a microprocessor.

35. A ripple rejection filter comprising:
   (a) an input port for receiving an input signal with a fixed frequency ripple;
   (b) analog filter means connected to input port and having a series resistance and a shunt capacitance for providing a filtered signal corresponding to the low frequency components of the input signal;
   (c) sampler means connected to the input port and sampling at a frequency having an average value equal to the fixed frequency of the ripple for providing a sampled signal;
   (d) digital filter means connected to the sampler means for providing a filtered representation for the sampled signal corresponding to the high frequency components of the input signal;
   (e) combining means for combining the filtered signal from the analog filter means and the filtered representation of the sampled signal from the digital filter means and for providing an output signal representative of the input signal with the ripple attentuated.

36. The ripple rejector filter of claim 35 wherein the analog filter means further comprises a characteristic time constant equal to the product of the resistance and capacitance.

37. The ripple rejection filter of claim 36 wherein the digital filter means further comprises a characteristic time constant substantially equal to the time constant of the analog filter means.

38. The ripple rejector filter of claim 37 wherein the digital filter comprises a software filter.

39. A ripple rejection filter in combination with a phase control system comprising:
   (a) a phase control system having an adjustable firing point in each phase:
   (b) first filter means having an input for receiving signal to be filtered and having an output for providing a filtered signal according to a low pass characteristic and a first filter means time constant;
   (c) firing point synchronized sampling means having an input connected to the signal to be filtered and having an output for providing a sampled signal sampled in synchronism with the firing point in each phase of the phase control system;
   (d) second filter means for receiving the sampled signal and for providing a filtered representation of the sampled signal according to a high pass characteristic with an effective time constant substantially equal to the first filter means time constant; and
   (e) combining means for combining the signals provided by the first and second filter means such that the resulting signal is representative of the signal to be filtered with the ripple substantially rejected.

* * * * *